US009778770B2

United States Patent
Xu

(10) Patent No.: US 9,778,770 B2
(45) Date of Patent: Oct. 3, 2017

(54) ARRAY SUBSTRATE OF OLED DISPLAY

(71) Applicant: Shenzhen China Star Optoelectronics Technology Co., Ltd., Shenzhen, Guangdong (CN)

(72) Inventor: Xiangyang Xu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/374,248

(22) PCT Filed: Apr. 17, 2014

(86) PCT No.: PCT/CN2014/075573
§ 371 (c)(1),
(2) Date: Oct. 21, 2016

(87) PCT Pub. No.: WO2015/149398
PCT Pub. Date: Oct. 8, 2015

(65) Prior Publication Data
US 2017/0045972 A1     Feb. 16, 2017

(30) Foreign Application Priority Data
Apr. 3, 2014 (CN) .......................... 2014 1 0132189

(51) Int. Cl.
G06F 3/041 (2006.01)
G09G 3/3233 (2016.01)
G09G 3/3225 (2016.01)
H01L 27/32 (2006.01)
G06F 3/044 (2006.01)

(52) U.S. Cl.
CPC ............ *G06F 3/0412* (2013.01); *G06F 3/044* (2013.01); *G09G 3/3225* (2013.01); *G09G 3/3233* (2013.01); *H01L 27/323* (2013.01); *H01L 27/3211* (2013.01); *H01L 27/3262* (2013.01); *H01L 27/3265* (2013.01); *G09G 2300/0861* (2013.01); *G09G 2310/0262* (2013.01);
(Continued)

(58) Field of Classification Search
CPC ............... G09G 3/3233; G09G 3/3225; G09G 2300/0861; G09G 2310/0262; G09G 2320/0223; G09G 2320/045; G06F 3/0412
See application file for complete search history.

(56) References Cited

U.S. PATENT DOCUMENTS

| 6,157,356 A * | 12/2000 | Troutman | ............ G09G 3/2022 345/205 |
| 8,330,677 B2 * | 12/2012 | Kim | ...................... G09G 3/3233 345/76 |
| 2006/0066252 A1 * | 3/2006 | Kim | ...................... G09G 3/3233 315/169.3 |

* cited by examiner

*Primary Examiner* — Vijay Shankar
(74) *Attorney, Agent, or Firm* — Andrew C. Cheng

(57) ABSTRACT

The present invention discloses an array substrate of OLED display, which comprises: multiple sub-pixel units defined by scanning control lines and data lines, each sub-pixel unit comprising a touch driving circuit, and the touch driving circuit comprising: a scanning transistor TFT1, a driving transistor TFT2, an organic light emitting diode OLED, a touch transistor TFT3, and a light sensing unit, so that the two adjacent organic light emitting diodes OLED in the adjacent frame cycles emit light alternately, and the light sensing unit connected with the organic light emitting diode OLED which does not emit light currently is in operation. In the embodiment of the present invention, it can improve the lifetime of the OLED and the display effects and the integration of the OLED displays.

5 Claims, 8 Drawing Sheets

(52) U.S. Cl.
CPC .............. *G09G 2320/0223* (2013.01); *G09G 2320/045* (2013.01)

ARRAY SUBSTRATE OF OLED DISPLAY

This application is claiming a priority arisen from a patent application, entitled with "Array Substrate of OLED Display", submitted to China Patent Office on Apr. 3, 2014, designated with an Application Number 201410132189.X. The whole and complete disclosure of such patent application is hereby incorporated by reference. This application is also related to National Stage Application No.: 14/374,240, submitted on the same date, entitled, "Pixel Driving Circuit and Array Substrate of OLED Display and the Corresponding Display"; and National Stage Application No.: 14/374,269, submitted on the same date, entitled, "Pixel Driving Circuit of OLED Display and the Driving Method Thereof" assigned to the same assignee.

BACKGROUND OF THE INVENTION

1. Field of the Invention

The present invention relates to the fields of pixel driving technology of the light emitting diode display, and in particular to an array substrate of organic light emitting diode (OLED) display.

2. The Related Arts

Organic Light Emitting Diode (OLED) has features of faster response, higher contrast, wider viewing angle and etc. compared to conventional liquid crystal panel. Hence, OLED has the increasingly widespread attention from the display technology developers.

FIG. 1 shows an active array OLED driving circuit of 2T1C according to the existing technology. Wherein, 2T1C indicates that the circuit comprises 2 TFT transistors and one capacitance (C). Wherein, the TFT1 is a switching thin film transistor, which is mainly used to control the on/off of the charging capacitance, the driving transistor TFT2 is used to drive the OLED, the capacitance C is used to store the gray scale voltage in the data line signal and thus control the driving current of TFT2 to OLED, Gate n is the n-th row of scanning signal lines, Data is the n-th column of data line and Vdd is a OLED driving line. The drain of the traditional driving transistor TFT2 is connected to the GND, which is unidirectional conductive drive, namely DC drive.

OLED emits light by the current generated from the driving transistor under saturated state. At present, OLED is facing a lot of problems, especially is the aging problem of OLED, which is the very common problem, faced by all of the current light-emitting OLED display. Due to most of the existing technology using DC drive technology, the transmission direction of holes and electrons is fixed, which are injected from the anode and cathode to the light emitting layer, respectively. Then, an exciton is formed in the light emitting layer with the radiation of light. The extra holes (or electrons) which are not recombined, or accumulate in the interface of the hole transport layer/light-emitting layer (or light-emitting layer/electron transporting layer), or cross over the barrier and flow into the electrode. With the extension of the usage time of OLED, many uncomplexed carrier will accumulated at the interface of the light emitting layer and form the built-in electric field inside the OLED. This will cause the threshold voltage Vth of the light emitting diodes to be increase continuously and reduced its luminescence brightness and energy efficiency. It does not help to solve the fundamental aging problem of OLED.

SUMMARY OF THE INVENTION

The technical issue to be solved by the present invention is to provide an array substrate of OLED display, which can improve the lifetime of the OLED and the display effects and the integration of the OLED displays.

In order to solve the technical issue, the present invention provides an array substrate of OLED display, which comprises: multiple sub-pixel units defined by scanning control lines and data lines, each sub-pixel unit comprising a touch driving circuit, and the touch driving circuit comprising:

a scanning transistor TFT1, the source thereof being connected to the data line, the gate thereof being connected to the scanning control line, the drain thereof being connected to a first terminal of a storage capacitor C1, and a second terminal of the storage capacitor C1 being grounded;

a driving transistor TFT2, the gate thereof being connected to the drain of the scanning transistor TFT1, and the drain thereof being grounded;

an organic light emitting diode OLED, the negative electrode thereof being connected to the source of the driving transistor TFT2; and a fourth transistor TFT4, the drain thereof being connected to the positive electrode of the organic light emitting diode OLED, the source thereof being connected to a power line Vdd, and the gate thereof being connected to a first pulse signal;

wherein, the frequency of the first pulse signal is the same as the frame frequency of the OLED display, and the amplitude thereof is larger than the threshold voltage of the fourth transistor TFT4; the phases of the first pulse signals connected with the two driving transistors TFT2 in the two adjacent sub-pixel units in the two adjacent rows of sub-pixel units are opposite, so that the two adjacent organic light emitting diodes OLED in the adjacent frame cycles emit light alternately.

Correspondingly, in another embodiment of the present invention, it provides an array substrate of OLED display, which comprises: multiple sub-pixel units defined by scanning control lines and data lines, each sub-pixel unit comprising a touch driving circuit, and the touch driving circuit comprising:

a scanning transistor TFT1, the source thereof being connected to the data line, the gate thereof being connected to the scanning control line, the drain thereof being connected to a first terminal of a storage capacitor C1, and a second terminal of the storage capacitor C1 being grounded;

a driving transistor TFT2, the gate thereof being connected to the drain of the scanning transistor TFT1, and the drain thereof being connected to a first pulse signal;

an organic light emitting diode OLED, the negative electrode thereof being connected to the source of the driving transistor TFT2, and the positive electrode thereof being connected to a power line Vdd;

wherein, every three sub-pixel units form a pixel unit, the frequency of the first pulse signal received by each driving transistor TFT2 in each pixel unit is the same, the frequency thereof is the same as the frame frequency of the OLED display, and the amplitude thereof is between Vdd to 2Vdd; the phases of the first pulse signals received by the two adjacent pixel units are opposite, so that the two adjacent organic light emitting diodes OLED in the adjacent frame cycles emit light alternately.

Wherein, the scanning time of the two scanning control lines respectively connected with the two adjacent rows of the pixel units at least partially overlap.

Correspondingly, in another embodiment of the present invention, it provides an array substrate of OLED display, which comprises: multiple sub-pixel units defined by scanning control lines and data lines, each sub-pixel unit comprising a touch driving circuit, and the touch driving circuit comprising:

a scanning transistor TFT1, the source thereof being connected to the data line, the gate thereof being connected to the scanning control line, the drain thereof being connected to a first terminal of a storage capacitor C1, and a second terminal of the storage capacitor C1 being grounded;

a driving transistor TFT2, the gate thereof being connected to the drain of the scanning transistor TFT1, and the drain thereof being grounded;

an organic light emitting diode OLED, the negative electrode thereof being connected to the source of the driving transistor TFT2; and a fourth transistor TFT4, the drain thereof being connected to the positive electrode of the organic light emitting diode OLED, the source thereof being connected to a power line Vdd, and the gate thereof being connected to a first pulse signal;

wherein, every three sub-pixel units form a pixel unit, the frequency of the first pulse signal received by each driving transistor TFT2 in each pixel unit is the same, the frequency thereof is the same as the frame frequency of the OLED display, and the amplitude thereof is larger than the threshold voltage of the fourth transistor TFT4; the phases of the first pulse signals received by the two adjacent pixel units are opposite, so that the two adjacent organic light emitting diodes OLED in the adjacent frame cycles emit light alternately.

Wherein, the scanning time of the two scanning control lines respectively connected with the two adjacent rows of the pixel units at least partially overlap.

The embodiment of the present invention has the following benefits:

In the embodiment of the present invention, the OLED circuits in the two adjacent pixel units utilize the first pulse signal to drive alternately, so that only one pixel unit in the two adjacent pixel units in a same frame cycle emit light and display, and the other sub-pixel unit doesn't emit light; both are changed in the next frame cycle; it is achieved that two pixel units emit light alternately, which can completely eliminate the incentive to make the light-emitting units aging, greatly extend the life time of the light-emitting units, eliminate the influence of the internal resistance on the photo-current in the circuit, and improve the quality of the screen display. Moreover, the scanning time of the two adjacent rows of gates is partially overlapped, so that the charging time of the coupling capacitor is doubled, which improves the charging efficiency of the sub-pixel unit. Furthermore, through the integrated touch circuit detection in the pixel driving circuit, it makes the pixel unit, which does not emit light in the current frame cycle, as a touch sensing unit, which improves the function and integration of the OLED display.

BRIEF DESCRIPTION OF THE DRAWINGS

In order to more clearly illustrate the embodiment of the present invention or the technical issue of the prior art, the accompanying drawings and the detailed descriptions are as follows. Obviously, the following description of the accompanying drawings are only some embodiments according to the present invention, for persons of ordinary skill in this field, they can also obtain other drawings based on these drawings without creative effort.

DETAILED DESCRIPTION OF THE PREFERRED EMBODIMENTS

The detailed descriptions accompanying drawings and the embodiment of the present invention are as follows.

Figure 1:
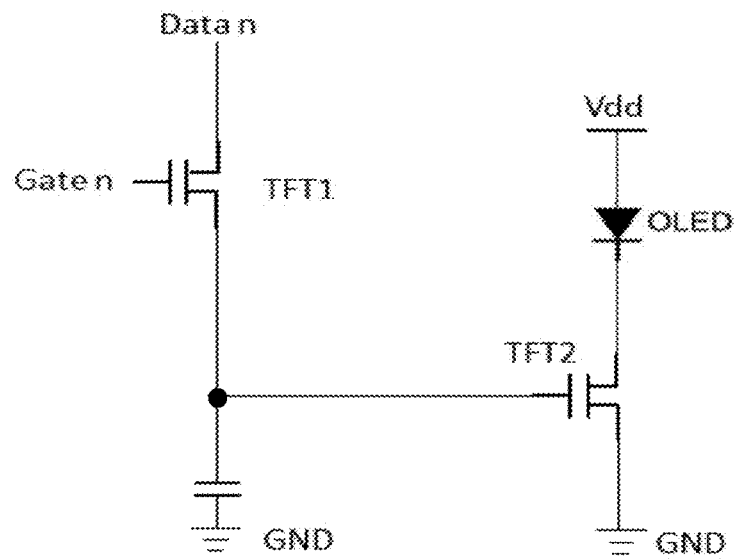
FIG. 1 is a pixel driving circuit of OLED display according to the existing technology.
Figure 2:
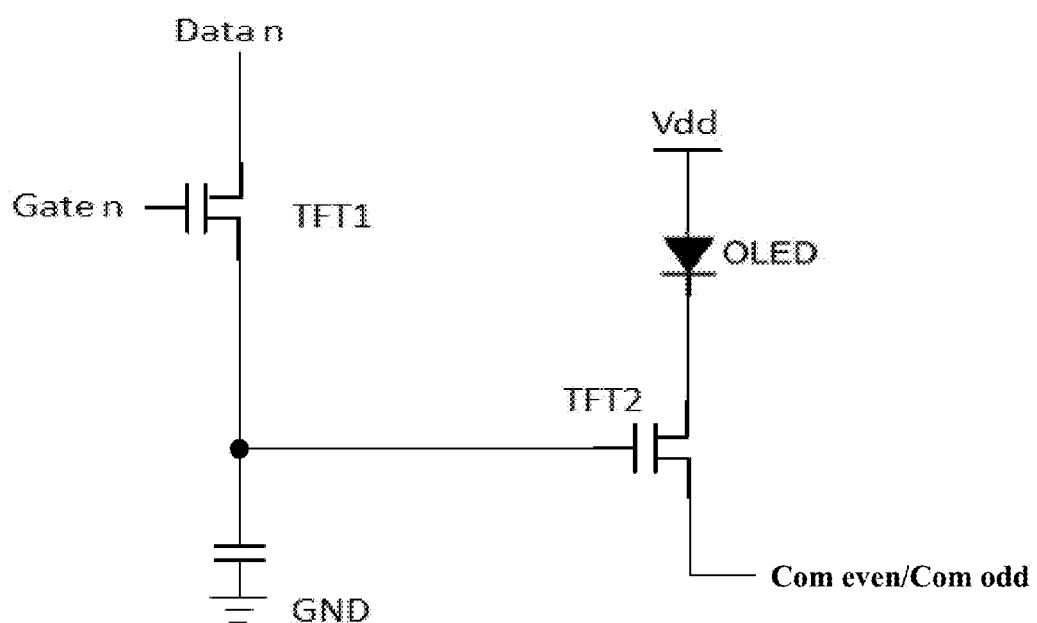
FIG. 2 is a schematic view illustrating the circuit of a pixel driving circuit of OLED display according to an embodiment of the present invention.

Referring to FIG. 2, it shows a schematic view illustrating the circuit of a pixel driving circuit of OLED display according to an embodiment of the present invention. In the embodiment, each driving circuit is located in a pixel point. The driving circuit utilizes a 2T1C structure, comprising:

a scanning transistor TFT1, the source thereof being connected to the data line, the gate thereof being connected to the scanning control line, the drain thereof being connected to a first terminal of a storage capacitor C1, and a second terminal of the storage capacitor C1 being grounded;

a driving transistor TFT2, the gate thereof being connected to the drain of the scanning transistor TFT1, and the drain thereof being connected to a first pulse signal; and an organic light emitting diode OLED, the negative electrode thereof being connected to the source of the driving transistor TFT2, and the positive electrode thereof being connected to a power line Vdd;

wherein, the first pulse signal can be a common electrode even signal (Com even) or a common electrode odd signal (Com odd), the alternating drive effects are formed by Com even or Com odd, the frequency thereof is the same as the frame frequency of the OLED display, and the amplitude thereof is between Vdd to 2Vdd. In this way, assuming the first pulse signal remains high potential in a frame cycle, and then the first pulse signal will remain low potential in the next frame cycle. Therefore, in a frame cycle, when the driving transistor TFT2 is turned on, if the first pulse signal remains low potential, then the organic light emitting diode OLED is turned on and emit light; in the next frame cycle, when the driving transistor TFT2 is turned on, because the first pulse signal is high potential with amplitude higher than Vdd at this time, the organic light emitting diode OLED is reversed and turned off, which will not emit light.

Using the driving circuit shown in FIG. 2 allows each pixel in two adjacent frame cycles, OLED can emit light in one frame cycle, while OLED doesn't emit light in the other frame cycle, which prolongs the life time of OLED.

Figure 3:
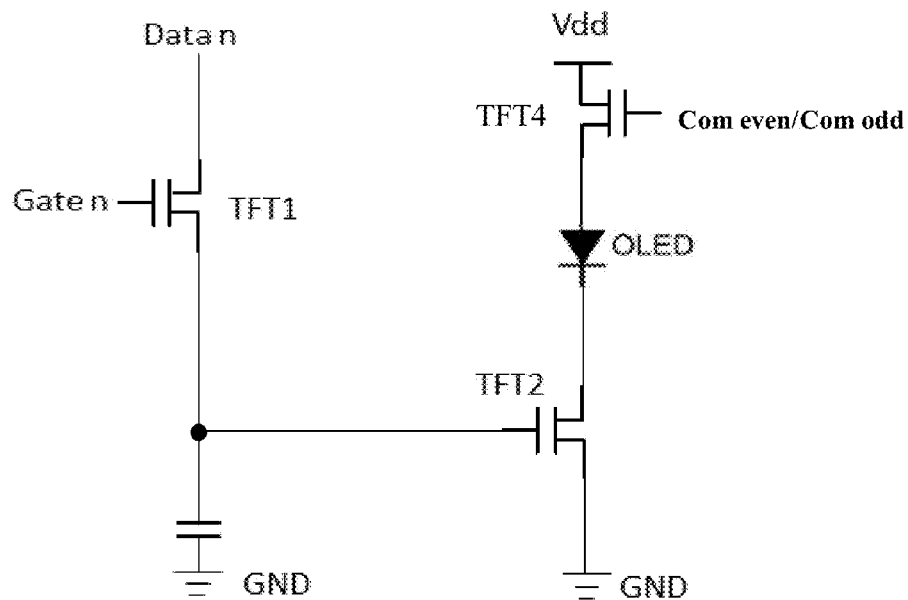
FIG. 3 is a schematic view illustrating the circuit of a pixel driving circuit of OLED display according to another embodiment of the present invention.

Referring to FIG. 3, it shows a schematic view illustrating the circuit of a pixel driving circuit of OLED display according to another embodiment of the present invention. In the embodiment, each driving circuit is located in a pixel point. The driving circuit utilizes a 3T1C structure, comprising:

a scanning transistor TFT1, the source thereof being connected to the data line, the gate thereof being connected to the scanning control line, the drain thereof being connected to a first terminal of a storage capacitor C1, and a second terminal of the storage capacitor C1 being grounded;

a driving transistor TFT2, the gate thereof being connected to the drain of the scanning transistor TFT1, and the drain thereof being grounded;

an organic light emitting diode OLED, the negative electrode thereof being connected to the source of the driving transistor TFT2;

a fourth transistor TFT4, the drain thereof being connected to the positive electrode of the organic light emitting diode OLED, the source thereof being connected to a power line Vdd, and the gate thereof being connected to a first pulse signal;

wherein, the first pulse signal can be a common electrode even signal (Com even) or a common electrode odd signal (Com odd), the alternating drive effects are formed by Com even or Com odd, the frequency thereof is the same as the frame frequency of the OLED display, and the amplitude thereof is larger than the threshold voltage Vth of the fourth transistor TFT4.

The working principle thereof is similar to that of the driving circuit shown in FIG. 2. Specifically, assuming the first pulse signal remains high potential in a frame cycle, and then the first pulse signal will remain low potential in the next frame cycle. Therefore, in a frame cycle, when the driving transistor TFT2 is turned on, if the first pulse signal is high potential, the fourth transistor TFT4 is turned on, then the organic light emitting diode OLED is turned on and emit light; in the next frame cycle, when the driving transistor TFT2 is turned on, because the first pulse signal is low potential at this time, the fourth transistor TFT4 is turned off, then the organic light emitting diode OLED will not emit light.

Similarly, using the driving circuit shown in FIG. 3 allows each pixel in two adjacent frame cycles, OLED can emit light in one frame cycle, while OLED doesn't emit light in the other frame cycle, which prolongs the life time of OLED.

Figure 4:
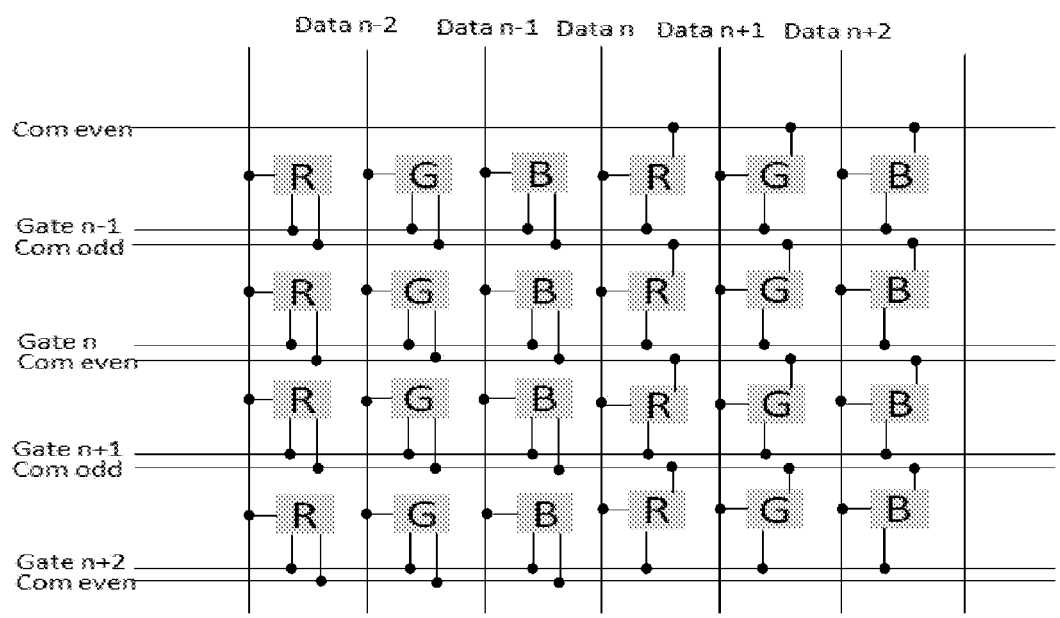
FIG. 4 is a schematic view illustrating the structure of an array substrate of OLED display utilizing the driving circuit shown in FIG. 2 according to an embodiment of the present invention.
Figure 5:
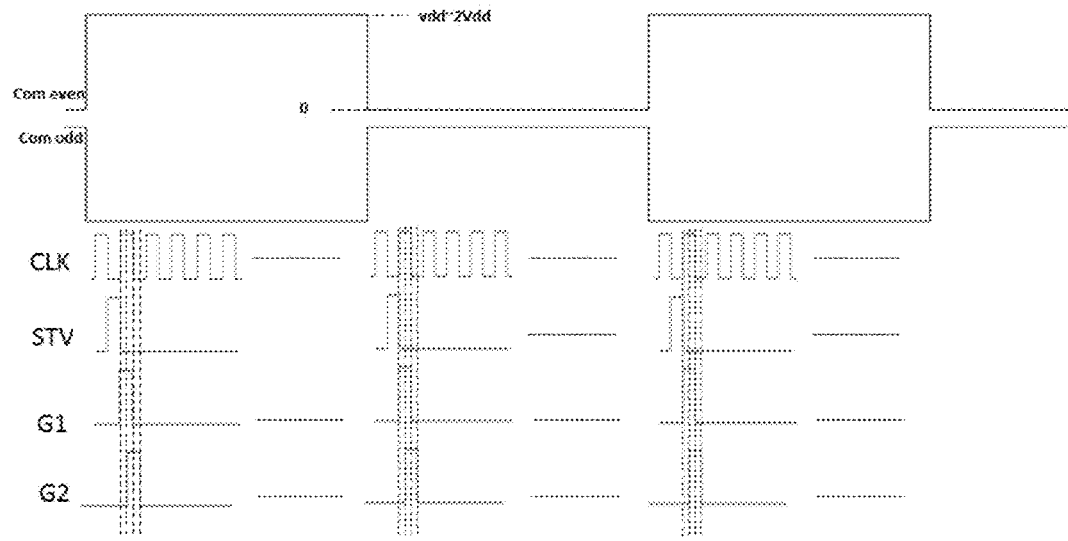
FIG. 5 is a driving timing diagram of the circuit shown in FIG. 4.
Figure 6:
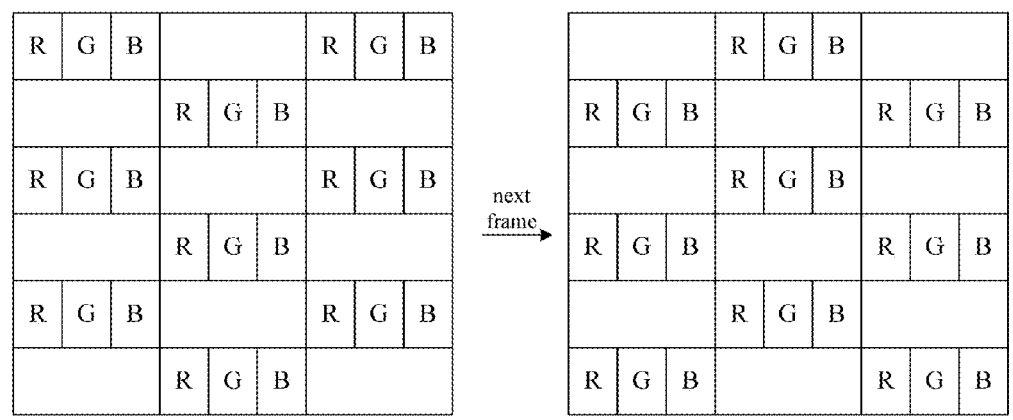
FIG. 6 is a schematic driving effects of the array substrate of OLED display shown in FIG. 4.

Referring to FIG. 4 combining with FIGS. 5 and 6, it shows a schematic view illustrating the structure of an array substrate of OLED display utilizing the driving circuit shown in FIG. 2 according to an embodiment of the present invention. In the embodiment, the array substrate comprises multiple sub-pixel units (shown as R, G, B, and etc. in Figure) defined by scanning control lines (Gate) and data lines (Data). Each sub-pixel unit utilizes the pixel driving circuit shown in FIG. 2, which specifically comprises:

a scanning transistor TFT1, the source thereof being connected to the data line, the gate thereof being connected to the scanning control line, the drain thereof being connected to a first terminal of a storage capacitor C1, and a second terminal of the storage capacitor C1 being grounded;

a driving transistor TFT2, the gate thereof being connected to the drain of the scanning transistor TFT1, and the drain thereof being connected to a first pulse signal; and an organic light emitting diode OLED, the negative electrode thereof being connected to the source of the driving transistor TFT2, and the positive electrode thereof being connected to a power line Vdd;

wherein, every three sub-pixel units (shown as R, G, and B pixels on a same row in Figure) form a pixel unit, the frequency of the first pulse signal received by each driving transistor TFT2 in each pixel unit is the same, the frequency thereof is the same as the frame frequency of the OLED display, and the amplitude thereof is between Vdd to 2Vdd; the phases of the first pulse signals received by the two adjacent pixel units are opposite, specifically, if the first pulse signal received by one of the pixel units is Com even, then the first pulse signal received by the adjacent pixel unit is Com odd. Wherein, the frequencies and the amplitudes of the Com even and the Com odd are the same, but the phases thereof are opposite, which specifically refers to the timing diagram shown in FIG. 5. According to the description of the working principle of the driving circuit shown in FIG. 2, the structure according to the present embodiment makes the organic light emitting diodes OLED in the two adjacent pixel units in the adjacent frame cycles emit light alternately. Namely, the OLED in the pixel unit can emit light in one frame cycle and the OLED in the adjacent pixel unit doesn't emit light, while the OLED in the pixel unit doesn't emit light and the OLED in the adjacent pixel unit emits light in the next frame cycle, which specifically refers to FIG. 6, which prolongs the life time of each OLED.

Furthermore, because the polarities of the first pulse signals between the upper and lower two pixels are opposite, the scanning time of the two scanning control lines (shown as G1 and G2 in FIG. 5) respectively connected with the two adjacent rows of the pixel units at least partially overlap (such as overlap ½ pulse width). Namely, the second half of the scanning time of the previous row scanning control line G1 overlaps the first half of the scanning time of the next row scanning control line G2, which specifically refers to FIG. 5. Therefore, the gate scanning cycle can be doubled, and the charging time of the pixel capacitor is doubled. Specifically, when the OLED in one pixel unit of the first row emit light in one frame cycle and the OLED in the next row doesn't emit light, the pixel units of the third row is charged. The pixel units of the third row will undergo charging without waiting for the end of the second row scanning, so that the charging efficiency of the capacitor is improved and the color reproduction of the OLED displayed image is higher.

It can be understood that the array substrate shown in FIG. 4 can also utilize the driving circuit shown in FIG. 3. The working principle thereof is similar to the description of the FIG. 4, which also has the display effects shown in FIG. 6, and the specific details are not described here.

Figure 7:
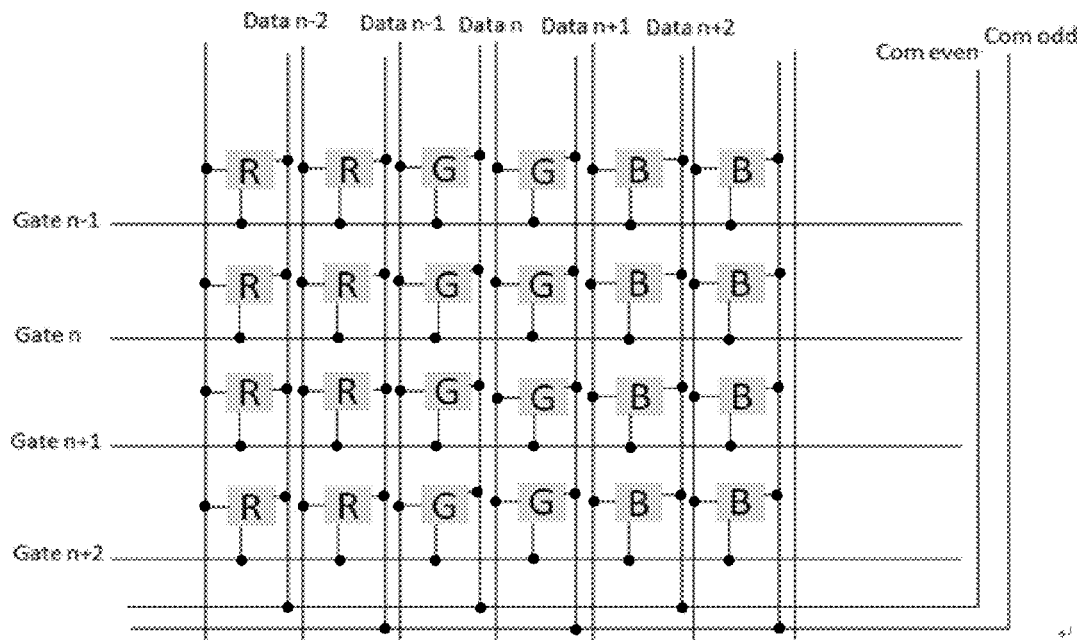
FIG. 7 is a schematic view illustrating the structure of an array substrate of OLED display utilizing the driving circuit shown in FIG. 2 according to an embodiment of the present invention.
Figure 8:
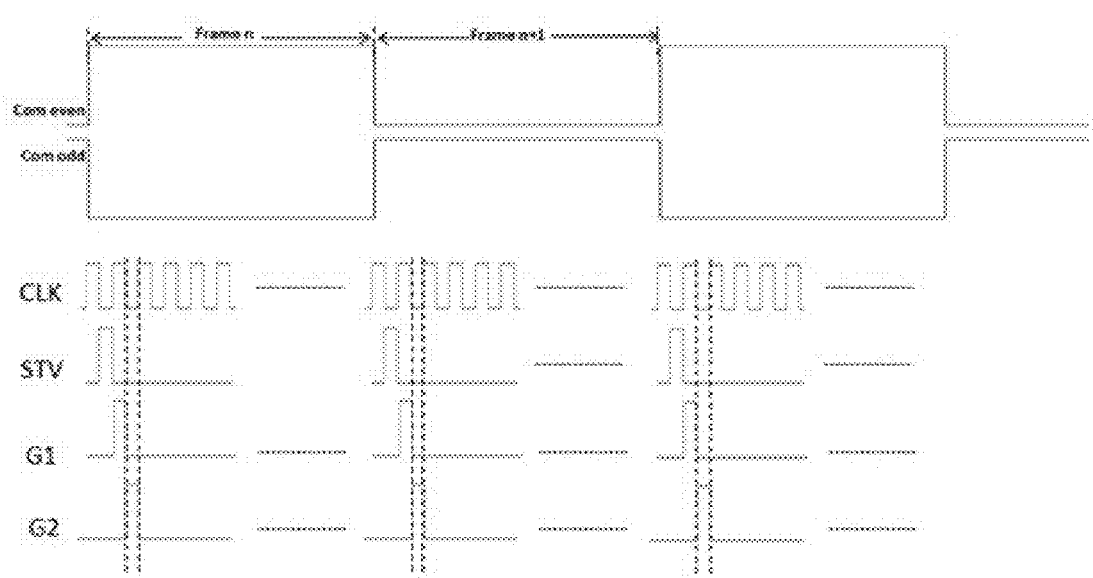
FIG. 8 is a driving timing diagram of the circuit shown in FIG. 7.
Figure 9:
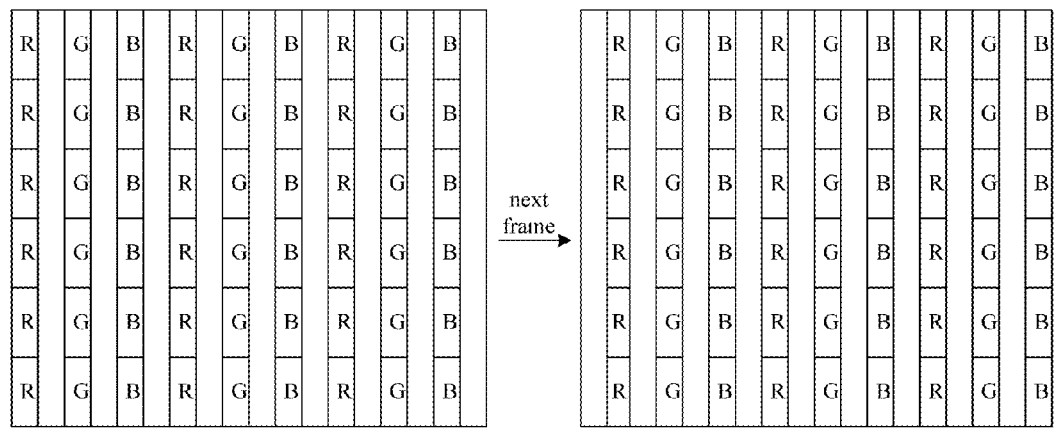
FIG. 9 is a schematic driving effects of the array substrate of OLED display shown in FIG. 7.

Referring to FIG. 7 combining with FIGS. 8 and 9, it shows a schematic view illustrating the structure of an array substrate of OLED display utilizing the driving circuit shown in FIG. 2 according to another embodiment of the present invention. In the embodiment, the arrangement of the pixel units slightly differs from the FIG. 4. Specifically, the array substrate comprises multiple sub-pixel units (shown as R, G, B, and etc. in Figure) defined by scanning control lines (Gate) and data lines (Data). Each sub-pixel unit utilizes the pixel driving circuit shown in FIG. 2, which specifically comprises:

a scanning transistor TFT1, the source thereof being connected to the data line, the gate thereof being connected to the scanning control line, the drain thereof being connected to a first terminal of a storage capacitor C1, and a second terminal of the storage capacitor C1 being grounded;

a driving transistor TFT2, the gate thereof being connected to the drain of the scanning transistor TFT1, and the drain thereof being connected to a first pulse signal; and an organic light emitting diode OLED, the negative electrode thereof being connected to the source of the driving transistor TFT2, and the positive electrode thereof being connected to a power line Vdd;

wherein, the frequency of the first pulse signal is the same as the frame frequency of the OLED display, and the amplitude thereof is between Vdd to 2Vdd; the phases of the first pulse signals connected with the two driving transistors TFT2 in the two adjacent sub-pixel units (two adjacent sub-pixels in a same row, such as two adjacent R pixels, two adjacent G pixels, or two adjacent B pixels) in the two adjacent rows of sub-pixel units are opposite, so that the two organic light emitting diodes OLED of the two adjacent sub-pixels in the adjacent frame cycles emit light alternately.

Specifically, if the first pulse signal received by one of the pixel units (such as R pixel) is Com even, then the first pulse signal received by the adjacent pixel unit (the adjacent R pixel) is Com odd. Wherein, the frequencies and the amplitudes of the Com even and the Com odd are the same, but the phases thereof are opposite, which specifically refers to the timing diagram shown in FIG. 8. According to the description of the working principle of the driving circuit shown in FIG. 2, the structure according to the present embodiment makes the organic light emitting diodes OLED in the two adjacent pixel units in the adjacent frame cycles emit light alternately. Namely, the OLED in the pixel unit can emit light in one frame cycle and the OLED in the adjacent pixel unit in the same row doesn't emit light, while the OLED in the pixel unit doesn't emit light and the OLED in the adjacent pixel unit in the same row emits light in the next frame cycle, which specifically refers to FIG. 9, which prolongs the life time of each OLED.

In FIG. 8, the scanning time of the two scanning control lines (shown as G1 and G2) respectively connected with the two adjacent rows of the pixel units don't overlap. It can be understood that, in the other embodiments, the scanning time of the two scanning control lines (shown as G1 and G2) respectively connected with the two adjacent rows of the pixel units at least partially overlap (such as overlap ½ pulse width). Namely, the second half of the scanning time of the previous row scanning control line G1 overlaps the first half of the scanning time of the next row scanning control line G2. Similarly, the charging efficiency of the capacitor is improved, and the color reproduction of the OLED displayed image is higher.

Figure 10:
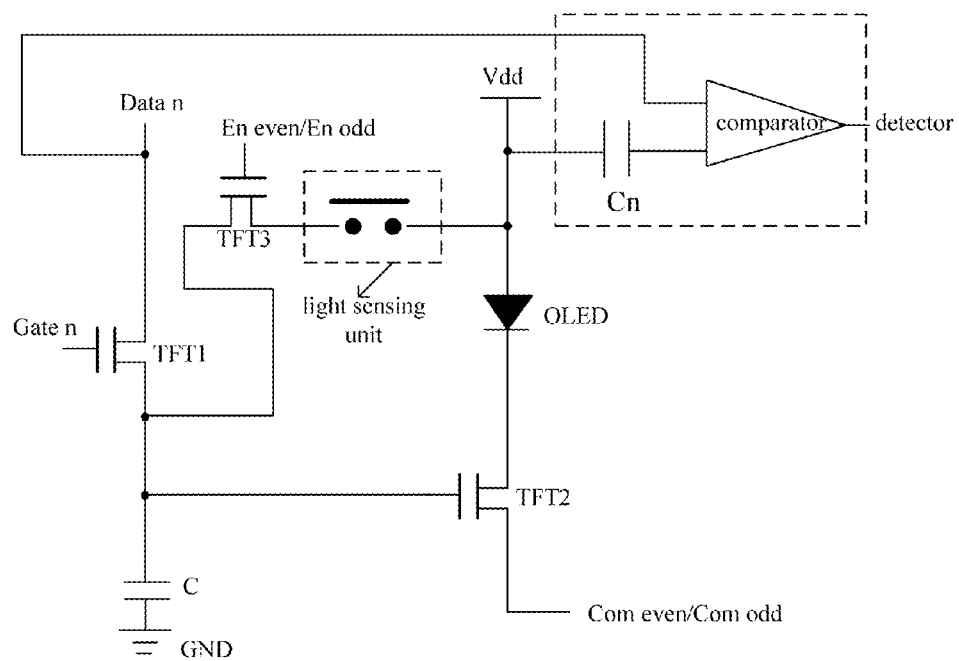
FIG. 10 is a schematic view illustrating the circuit of a pixel driving circuit of OLED display according to another embodiment of the present invention.

Referring to FIG. 10, it shows a schematic view illustrating the circuit of a touch driving circuit of OLED display according to an embodiment of the present invention. In the embodiment, each touch driving circuit is provided in a pixel unit, and the touch driving circuit comprises a touch sensing circuit. Specifically, the touch driving circuit comprises:

a scanning transistor TFT1, the source thereof being connected to the data line, the gate thereof being connected to the scanning control line, the drain thereof being connected to a first terminal of a storage capacitor C1, and a second terminal of the storage capacitor C1 being grounded;

a driving transistor TFT2, the gate thereof being connected to the drain of the scanning transistor TFT1, and the drain thereof being connected to a first pulse signal;

an organic light emitting diode OLED, the negative electrode thereof being connected to the source of the driving transistor TFT2, and the positive electrode thereof being connected to a power line Vdd;

a touch transistor TFT3, the drain thereof being connected to the drain of the scanning transistor TFT1, the gate thereof being connected to a first touch enable signal, a first terminal thereof being connected to the source of the touch transistor TFT3, and a second terminal thereof being connected to the positive electrode of the organic light emitting diode OLED; wherein, the first touch enable signal can be En even signal or En odd signal, the frequencies and the amplitudes of both En even signal and En odd signal are the same, but the phases thereof are opposite;

wherein, the frequency of the first pulse signal is the same as the frame frequency of the OLED display, and the amplitude thereof is between Vdd to 2Vdd, the cycles of the first touch enable signal ad the first pulse signal are synchronous, and the amplitude thereof is larger than the threshold voltage Vth of the touch transistor TFT3; through the above structure, in an emitting phase of one frame cycle, if the driving transistor TFT2 is turned on, and the first pulse signal is in low level, then the OLED will be turned on and emit light, in addition, the first touch enable signal (such as En even signal) is in low level at this time, the touch transistor TFT3 is cutoff and the light sensing unit doesn't work; in the next emitting phase of one frame cycle, if the driving transistor TFT2 is turned on, the first pulse signal is in high level (higher than Vdd), the OLED will be cutoff and not emit light, in addition, the first touch enable signal (such as En even signal) is in high level at this time, the touch transistor TFT3 is turned on and the light sensing unit is in operation, which can receive the information and identify the touch signal.

Moreover, the touch driving circuit is connected to a touch judging circuit provided outside the OLED display area, which can be provided one or more according to the requirement, comprising:

a filter capacitor Cn, one terminal thereof being connected to the second terminal of the light sensing unit of the pixel unit; and a comparator, a first input terminal thereof being connected to the data line of the pixel unit, a second input terminal thereof being connected to the other terminal of the filter capacitor Cn, and an output terminal thereof being connected to a detector, which is used to check if there is touch action or not.

Figure 11:
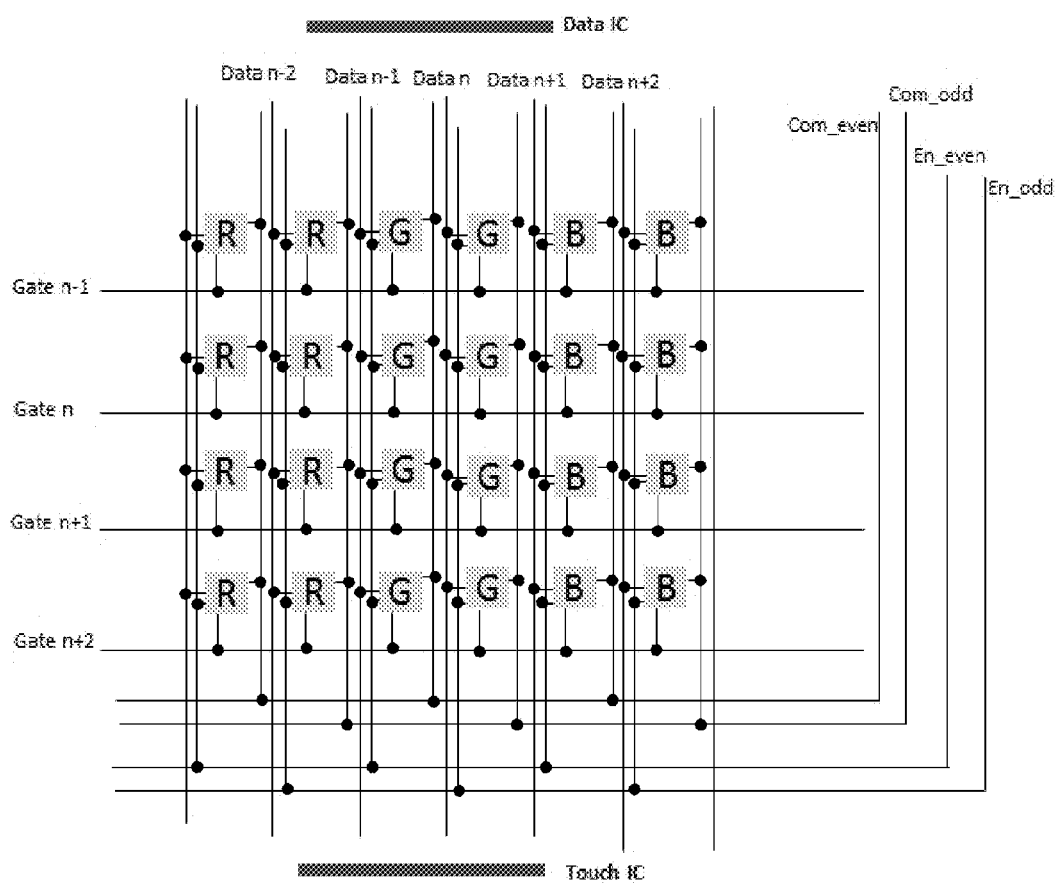
FIG. 11 is a schematic view illustrating the structure of an array substrate of OLED display utilizing the driving circuit shown in FIG. 10 according to an embodiment of the present invention.
Figure 12:
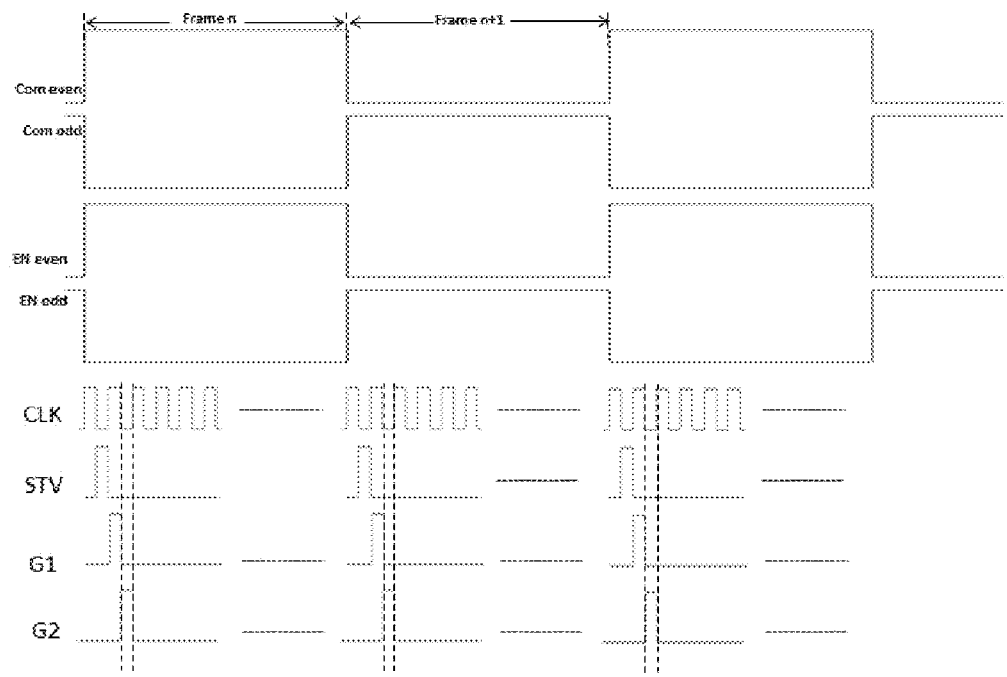
FIG. 12 is a driving timing diagram of the circuit shown in FIG. 11.
Figure 13:
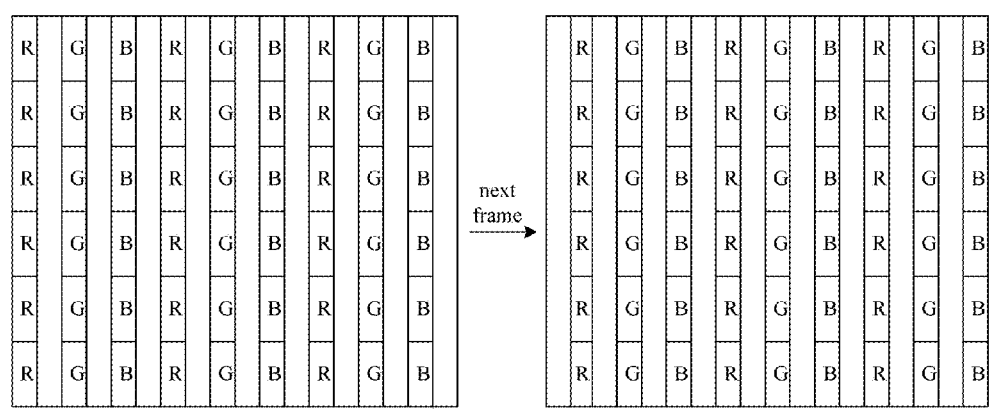
FIG. 13 is a schematic driving effects of the array substrate of OLED display shown in FIG. 11.

Referring to FIG. 11 combining with FIGS. 12 and 13, it shows a schematic view illustrating the structure of an array substrate of OLED display utilizing the driving circuit shown in FIG. 10 according to an embodiment of the present invention. In the embodiment, the array substrate comprises multiple sub-pixel units (shown as R, G, B, and etc. in Figure) defined by scanning control lines (Gate) and data lines (Data). Each sub-pixel unit utilizes the touch driving circuit shown in FIG. 10, specifically the touch driving circuit comprises:

a scanning transistor TFT1, the source thereof being connected to the data line, the gate thereof being connected to the scanning control line, the drain thereof being connected to a first terminal of a storage capacitor C1, and a second terminal of the storage capacitor C1 being grounded;

a driving transistor TFT2, the gate thereof being connected to the drain of the scanning transistor TFT1, and the drain thereof being connected to a first pulse signal;

an organic light emitting diode OLED, the negative electrode thereof being connected to the source of the driving transistor TFT2, and the positive electrode thereof being connected to a power line Vdd;

a touch transistor TFT3, the drain thereof being connected to the drain of the scanning transistor TFT1, the gate thereof being connected to a first touch enable signal; and a light sensing unit, a first terminal thereof being connected to the source of the touch transistor TFT3, a second terminal thereof being connected to the positive electrode of the organic light emitting diode OLED;

wherein, the frequency of the first pulse signal is the same as the frame frequency of the OLED display, the amplitude thereof is between Vdd to 2Vdd, and the cycle times of the first touch enable signal and the first pulse signal are synchronous; the phases of the first pulse signals connected with the two driving transistors TFT2 in the two adjacent sub-pixel units (two adjacent sub-pixels in a same row, such as two adjacent R pixels, two adjacent G pixels, or two adjacent B pixels) in the two adjacent rows of sub-pixel units are opposite, for example, the first pulse signal utilized in the first sub-pixel unit is Com even signal, then the first pulse signal utilized in the adjacent second sub-pixel unit is Com odd signal, the first touch enable signal utilized in the first sub-pixel unit is En even signal, and the first touch enable signal utilized in the adjacent second sub-pixel unit is En odd signal; specifically refers to the timing diagram shown in FIG. 12 combining with the descriptions of FIGS. 7 and 10, the structure in FIG. 11 achieves that the two adjacent organic light emitting diodes OLED in the adjacent frame cycles emit light alternately, and the light sensing unit connected with the organic light emitting diode OLED which does not emit light currently is in operation, which can refer to FIG. 13, so that it can prolong the life time of each OLED and have the touch function.

In FIG. 12, the scanning time of the two scanning control lines (shown as G1 and G2) respectively connected with the two adjacent rows of the pixel units don't overlap. It can be understood that, in the other embodiments, the scanning time of the two scanning control lines (shown as G1 and G2) respectively connected with the two adjacent rows of the pixel units at least partially overlap (such as overlap ½ pulse width). Namely, the second half of the scanning time of the previous row scanning control line G1 overlaps the first half of the scanning time of the next row scanning control line G2. Similarly, the charging efficiency of the capacitor is improved, and the color reproduction of the OLED displayed image is higher.

Figure 14:
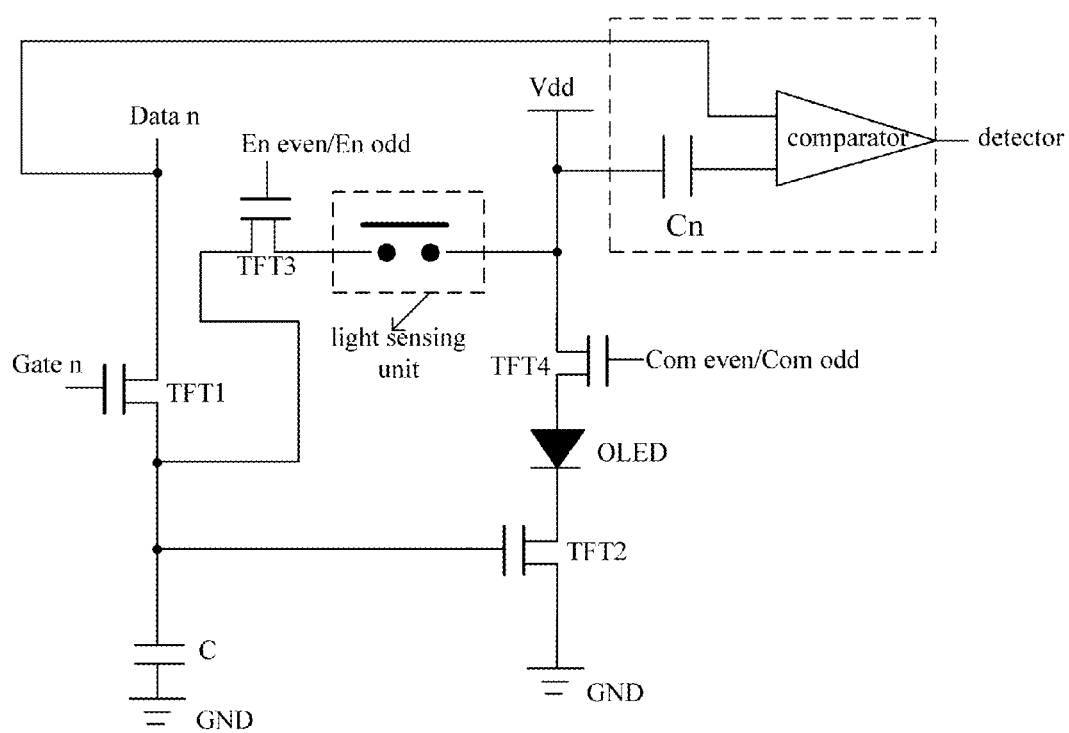
FIG. 14 is a schematic view illustrating the circuit of a pixel driving circuit of OLED display according to another embodiment of the present invention.

Referring to FIG. 14, it shows a schematic view illustrating the circuit of a pixel driving circuit of OLED display according to an embodiment of the present invention. In the embodiment, each touch driving circuit is provided in a pixel unit, the touch driving circuit comprises:

a scanning transistor TFT1, the source thereof being connected to the data line, the gate thereof being connected to the scanning control line, the drain thereof being connected to a first terminal of a storage capacitor C1, and a second terminal of the storage capacitor C1 being grounded;

a driving transistor TFT2, the gate thereof being connected to the drain of the scanning transistor TFT1, and the drain thereof being grounded;

an organic light emitting diode OLED, the negative electrode thereof being connected to the source of the driving transistor TFT2;

a fourth transistor TFT4, the drain thereof being connected to the positive electrode of the organic light emitting diode OLED, the source thereof being connected to a power line Vdd, and the gate thereof being connected to a first pulse signal;

a touch transistor TFT3, the drain thereof being connected to the drain of the scanning transistor TFT1, the gate thereof being connected to a first touch enable signal; and a light sensing unit, a first terminal thereof being connected to the source of the touch transistor TFT3, a second terminal thereof being connected to the source of the fourth transistor TFT4, the light sensing unit is resistive light sensing unit or photoelectric light sensing unit;

wherein, the frequency of the first pulse signal is the same as the frame frequency of the OLED display, the amplitude thereof is larger than the threshold voltage of the fourth transistor TFT4, and the first touch enable signal and the first pulse signal have the same frequency and opposite phases; through the above structure, in an emitting phase of one frame cycle, if the driving transistor TFT2 is turned on, and the first pulse signal is in high level, then the fourth transistor TFT4 will be turned on and the OLED is turned on and emit light, in addition, the first touch enable signal is in low level at this time, the touch transistor TFT3 is cutoff and the light sensing unit doesn't work; in the next emitting phase of one frame cycle, if the driving transistor TFT2 is turned on, the first pulse signal is in low level, then the fourth transistor TFT4 will be cutoff and the OLED will not emit light, in addition, the first touch enable signal is in high level at this time, the touch transistor TFT3 is turned on and the light sensing unit is in operation, which can receive the information and identify the touch signal.

Furthermore, the driving is connected with a touch judging circuit. The touch judging circuit is generally provided outside the OLED display area, which can be provided one or more according to the requirement, comprising: a filter capacitor Cn, one terminal thereof being connected to the second terminal of the light sensing unit of the sub-pixel unit; and a comparator, a first input terminal thereof being connected to the data line of the sub-pixel unit, a second input terminal thereof being connected to the other terminal of the filter capacitor Cn, and an output terminal thereof being connected to a detector. Wherein, the filter capacitor Cn is mainly used to DC block and filter the Vdd, and the comparator determines whether there is a touch or not through comparing the matching degree of the filter capacitor Cn filter signal and the data signal.

It can be understood that, in FIG. 11, it can utilize the touch driving circuit in FIG. 14 to achieve the similar function. Specifically, the array substrate of OLED display, which comprises multiple sub-pixel units defined by scanning control lines and data lines; wherein, each sub-pixel unit comprises a touch driving circuit, the touch driving circuit comprises:
- a scanning transistor TFT1, the source thereof being connected to the data line, the gate thereof being connected to the scanning control line, the drain thereof being connected to a first terminal of a storage capacitor C1, and a second terminal of the storage capacitor C1 being grounded;
- a driving transistor TFT2, the gate thereof being connected to the drain of the scanning transistor TFT1, and the drain thereof being grounded;
- an organic light emitting diode OLED, the negative electrode thereof being connected to the source of the driving transistor TFT2;
- a fourth transistor TFT4, the drain thereof being connected to the positive electrode of the organic light emitting diode OLED, the source thereof being connected to a power line Vdd, and the gate thereof being connected to a first pulse signal;
- a touch transistor TFT3, the drain thereof being connected to the drain of the scanning transistor TFT1, the gate thereof being connected to a first touch enable signal; and
- a light sensing unit, a first terminal thereof being connected to the source of the touch transistor TFT3, a second terminal thereof being connected to the source of the fourth transistor TFT4;
- wherein, the frequency of the first pulse signal is the same as the frame frequency of the OLED display, the amplitude thereof is larger than the threshold voltage of the fourth transistor TFT4, and the first touch enable signal and the first pulse signal have the same frequency and opposite phases; the phases of the first pulse signals connected with the two driving transistors TFT2 in the two adjacent sub-pixel units in the two adjacent rows of sub-pixel units are opposite, so that the two adjacent organic light emitting diodes OLED in the adjacent frame cycles emit light alternately, and the light sensing unit connected with the organic light emitting diode OLED which does not emit light currently is in operation.

The working timing diagram and the effects thereof are similar to FIG. 12 and FIG. 13, which the frequency of the first pulse signal in a sub-pixel unit just keep the same as the frame frequency of the OLED display, the amplitude thereof is larger than the threshold voltage of the fourth transistor TFT4, and the first touch enable signal and the first pulse signal have the same frequency and opposite phases. For example, in the two adjacent sub-pixel units of the two adjacent rows of sub-pixels, the first pulse signal utilized in the first sub-pixel unit is Com even signal, then the first pulse signal utilized in the adjacent second sub-pixel unit is Com odd signal, the first touch enable signal utilized in the first sub-pixel unit is En even signal, and the first touch enable signal utilized in the adjacent second sub-pixel unit is En odd signal. The specific working principle can refer to the above descriptions, which is not repeated here.

The embodiment of the present invention has the following benefits:

In the embodiment of the present invention, the OLED circuits in the two adjacent pixel units utilize the first pulse signal to drive alternately, so that only one pixel unit in the two adjacent pixel units in a same frame cycle emit light and display, and the other sub-pixel unit doesn't emit light; both are changed in the next frame cycle; it is achieved that two pixel units emit light alternately, which can completely eliminate the incentive to make the light-emitting units aging, greatly extend the life time of the light-emitting units, eliminate the influence of the internal resistance on the photo-current in the circuit, and improve the quality of the screen display. Moreover, the scanning time of the two adjacent rows of gates is partially overlapped, so that the charging time of the coupling capacitor is doubled, which improves the charging efficiency of the sub-pixel unit. Furthermore, through the integrated touch circuit detection in the pixel driving circuit, it makes the pixel unit, which does not emit light in the current frame cycle, as a touch sensing unit, which improves the function and integration of the OLED display.

The preferred embodiments of the present invention have been described, but not intending to impose any unduly constraint to the appended claims. Any deduction or modification according to the present invention is considered encompassed in the scope of protection defined by the clams of the present invention.

What is claimed is:

1. An array substrate of OLED display, which comprises multiple sub-pixel units defined by scanning control lines and data lines; wherein, each sub-pixel unit comprises a touch driving circuit, the touch driving circuit comprises:
   - a scanning transistor TFT1, a source thereof being connected to one of the data lines, a gate thereof being connected to one of the scanning control lines, a drain thereof being connected to a first terminal of a storage capacitor C1, and a second terminal of the storage capacitor C1 being grounded;
   - a driving transistor TFT2, a gate thereof being connected to the drain of the scanning transistor TFT1, and a drain thereof being grounded;
   - an organic light emitting diode OLED, a negative electrode thereof being connected to a source of the driving transistor TFT2; and
   - a fourth transistor TFT4, a drain thereof being connected to a positive electrode of the organic light emitting diode OLED, a source thereof being connected to a power line Vdd, and a gate thereof being connected to a first pulse signal;
   - wherein, a frequency of the first pulse signal is the same as a frame frequency of the OLED display, and an amplitude thereof is larger than a threshold voltage of the fourth transistor TFT4; and phases of the first pulse signals connected with the two driving transistors TFT2 in the two adjacent sub-pixel units in the two adjacent rows of sub-pixel units are opposite, so that the two adjacent organic light emitting diodes OLED in the adjacent frame cycles emit light alternately.

2. An array substrate of OLED display, which comprises multiple sub-pixel units defined by scanning control lines and data lines; wherein, each sub-pixel unit comprises a touch driving circuit, the touch driving circuit comprises:
   - a scanning transistor TFT1, a source thereof being connected to one of the data lines, a gate thereof being connected to one of the scanning control lines, a drain thereof being connected to a first terminal of a storage capacitor C1, and a second terminal of the storage capacitor C1 being grounded;
   - a driving transistor TFT2, a gate thereof being connected to the drain of the scanning transistor TFT1, and a drain thereof being connected to a first pulse signal; and
   - an organic light emitting diode OLED, a negative electrode thereof being connected to a source of the driving transistor TFT2, and a positive electrode thereof being connected to a power line Vdd;
   - wherein, every three sub-pixel units form a pixel unit, a frequency of the first pulse signal received by each driving transistor TFT2 in each pixel unit is the same, the frequency is the same as a frame frequency of the OLED display, and an amplitude thereof is between Vdd to 2Vdd; and phases of the first pulse signals received by the two adjacent pixel units are opposite, so that the two adjacent organic light emitting diodes OLED in the adjacent frame cycles emit light alternately.

3. The array substrate of OLED display as claimed in claim 2, wherein the scanning time of the two scanning control lines respectively connected with the two adjacent rows of the pixel units at least partially overlap.

4. An array substrate of OLED display, which comprises multiple sub-pixel units defined by scanning control lines and data lines; wherein, each sub-pixel unit comprises a touch driving circuit, the touch driving circuit comprises:
- a scanning transistor TFT1, a source thereof being connected to one of the data lines, a gate thereof being connected to one of the scanning control lines, a drain thereof being connected to a first terminal of a storage capacitor C1, and a second terminal of the storage capacitor C1 being grounded;
- a driving transistor TFT2, a a gate thereof being connected to the drain of the scanning transistor TFT1, and a drain thereof being grounded;
- an organic light emitting diode OLED, a negative electrode thereof being connected to a source of the driving transistor TFT2; and
- a fourth transistor TFT4, a drain thereof being connected to a positive electrode of the organic light emitting diode OLED, a source thereof being connected to a power line Vdd, and a gate thereof being connected to a first pulse signal;
- wherein, every three sub-pixel units form a pixel unit, a frequency of the first pulse signal received by each driving transistor TFT2 in each pixel unit is the same, the frequency is the same as a frame frequency of the OLED display, and an amplitude thereof is larger than a threshold voltage of the fourth transistor TFT4; and phases of the first pulse signals received by the two adjacent pixel units are opposite, so that the two adjacent organic light emitting diodes OLED in the adjacent frame cycles emit light alternately.

5. The array substrate of OLED display as claimed in claim 4, wherein the scanning time of the two scanning control lines respectively connected with the two adjacent rows of the pixel units at least partially overlap.

\* \* \* \* \*